(12) United States Patent  
Chang et al.

(10) Patent No.: US 12,119,576 B2  
(45) Date of Patent: Oct. 15, 2024

(54) PRESS-FIT POWER MODULE AND RELATED METHODS

(71) Applicant: SEMICONDUCTOR COMPONENTS INDUSTRIES, LLC, Phoenix, AZ (US)

(72) Inventors: Jie Chang, Suzhou (CN); Huibin Chen, Suzhou (CN); Tiburcio Maldo, Consolacion (PH); Keunhyuk Lee, Suzhou (CN)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 810 days.

(21) Appl. No.: 17/064,663

(22) Filed: Oct. 7, 2020

(65) Prior Publication Data

US 2021/0021065 A1  Jan. 21, 2021

Related U.S. Application Data

(60) Division of application No. 16/736,277, filed on Jan. 7, 2020, now Pat. No. 10,804,626, which is a  
(Continued)

(51) Int. Cl.  
*H01R 12/58* (2011.01)  
*H01L 23/495* (2006.01)  
(Continued)

(52) U.S. Cl.  
CPC ..... *H01R 12/585* (2013.01); *H01L 23/49517* (2013.01); *H01L 23/49541* (2013.01);  
(Continued)

(58) Field of Classification Search  
CPC ......... H01L 23/49555; H01L 23/49579; H01L 23/49541; H01L 23/49517; H01L 23/498;  
(Continued)

(56) References Cited

U.S. PATENT DOCUMENTS

| | | | |
|---|---|---|---|
| 5,652,471 | A | 7/1997 | Mayer et al. |
| 6,722,928 | B1 | 4/2004 | Noda et al. |

(Continued)

FOREIGN PATENT DOCUMENTS

| | | | |
|---|---|---|---|
| CN | 102222823 | A | 10/2011 |
| CN | 104919657 | A | 9/2015 |

(Continued)

OTHER PUBLICATIONS

German Search Report, German Patent Application No. 102019100106.4, Aug. 2, 2019, 9 pages.

*Primary Examiner* — Fazli Erdem  
(74) *Attorney, Agent, or Firm* — Adam R. Stephenson, LTD.

(57) ABSTRACT

Implementations of semiconductor packages may include: one or more die electrically coupled to a lead frame. The lead frame may be included within a housing. The semiconductor package may also include a set of signal leads extending from the housing, a set of power leads extending from the housing, and a plurality of press fit pins each fixedly coupled to the set of signal leads and the set of power leads. The set of signal leads and the set of power leads may be configured to couple with a substrate.

20 Claims, 5 Drawing Sheets

Related U.S. Application Data continuation of application No. 15/865,498, filed on Jan. 9, 2018, now Pat. No. 10,566,713.

(51) Int. Cl.
    *H01L 23/498*     (2006.01)
    *H01R 13/03*     (2006.01)
    *H05K 3/30*     (2006.01)

(52) U.S. Cl.
    CPC .. *H01L 23/49555* (2013.01); *H01L 23/49579* (2013.01); *H01L 23/49811* (2013.01); *H01R 13/03* (2013.01); *H05K 3/308* (2013.01); *H05K 2201/1059* (2013.01)

(58) Field of Classification Search
    CPC ............ H01L 23/495; H01L 23/49811; H01L 21/4896; H01L 24/12; H01L 24/85; H01L 23/4952; H01L 23/49582; H01L 23/49866; H05K 3/306; H05K 2201/1059; H05K 2201/10946; H05K 3/30; H05K 3/308; H01R 12/585; H01R 13/03; H01R 12/58
    USPC ........................................................ 438/461
See application file for complete search history.

(56) References Cited

U.S. PATENT DOCUMENTS

| | | | |
|---|---|---|---|
| 7,494,389 | B1 | 2/2009 | Essert et al. |
| 9,806,443 | B1 | 10/2017 | Thackston |
| 10,566,713 | B2 * | 2/2020 | Chang ................... H05K 3/308 |
| 2006/0152406 | A1 | 7/2006 | Leblanc et al. |
| 2008/0054442 | A1 | 3/2008 | Kanschat et al. |
| 2012/0275121 | A1 | 11/2012 | Hauenstein |
| 2014/0120760 | A1 | 5/2014 | Zieman et al. |
| 2016/0247735 | A1 | 8/2016 | Lin et al. |
| 2016/0316567 | A1 | 10/2016 | Gruber et al. |
| 2018/0012828 | A1 * | 1/2018 | Beer ................. H01L 23/49537 |

FOREIGN PATENT DOCUMENTS

| | | | | |
|---|---|---|---|---|
| CN | 106463853 | A | | 2/2017 |
| DE | 4421358 | A1 | | 12/1995 |
| DE | 2006057143 | | * | 6/2008 .......... H01R 12/585 |
| DE | 102006057143 | A1 | | 6/2008 |
| DE | 102010029867 | A1 | | 12/2011 |
| DE | 102016224586 | A1 | | 6/2017 |
| JP | 2008210942 | A | | 9/2008 |
| KR | 20110092779 | | * | 8/2011 ............ H01L 24/06 |
| KR | 1020110092779 | A | | 8/2011 |

* cited by examiner

PRESS-FIT POWER MODULE AND RELATED METHODS

CROSS REFERENCE TO RELATED APPLICATIONS

This application is a divisional application of the earlier U.S. Utility patent application to Jie Chang, et al., entitled "Press-fit Power Module and Related Methods," application Ser. No. 16/736,277, filed Jan. 7, 2020, now pending, which is a continuation application of the earlier U.S. Utility patent application to Jie Chang, et al. entitled "Press-fit Power Module and Related Methods," application Ser. No. 15/865, 498, filed Jan. 9, 2018, now U.S. Pat. No. 10,566,713, issued Feb. 18, 2020, the disclosures of each of which are hereby incorporated entirely herein by reference.

BACKGROUND

1. Technical Field

Aspects of this document relate generally to semiconductor packages, such as power modules for home appliances, the automotive industry, and industrial applications.

2. Background

To couple semiconductor packages to substrates such as printed circuit boards, the leads are soldered to the substrates. Other designs include leads having a press fit pin structure at the terminal end of the leads.

SUMMARY

Implementations of semiconductor packages may include: one or more die electrically coupled to a lead frame. The lead frame may be included within a housing. The semiconductor package may also include a set of signal leads extending from the housing, a set of power leads extending from the housing, and a plurality of press fit pins each fixedly coupled to the set of signal leads and the set of power leads. The set of signal leads and the set of power leads may be configured to couple with a substrate.

Implementations of semiconductor packages may include one, all, or any of the following:

The one or more die electrically coupled to a lead frame may be a power module.

The press fit pins may be coupled to the signal leads and the power leads through welding, soldering, or brazing.

The set of signal leads may be on a first side of the housing and the set of power leads may be on a second side of the housing opposite the first side.

The substrate may be a printed circuit board.

The plurality of press fit pins may include copper.

Implementations of semiconductor packages may include: a power module having a set of signal leads coupled to the power module; a set of power leads coupled to the power module on a side of the power module opposing the set of signal leads; and a press fit pin welded, soldered, or brazed to each of the signal leads and to each of the power leads. The press fit pin may be configured to couple with a circuit board.

Implementations of semiconductor packages may include one, all, or any of the following:

The power module may include one of a switch, a rectifier, or an inverter.

The press fit pin may be coupled to one of the set of signal leads and to one of the set of power leads through welding, soldering, or brazing using a jig.

The power module may further include a leadframe having the set of signal leads and the set of power leads.

The leadframe may include 99.9% purity copper.

The plurality of press fit pins may include a CuCrAgFeTiSi alloy.

Implementations of a method of manufacturing semiconductor packages may include: providing a power module having a set of signal leads on a first side and a set of power leads on a second side. The method may also include trimming a length of the set of signal leads and a length of the set of power leads and welding, soldering, or brazing a press fit pin of a plurality of press fit pins to each of the signal leads and to each of the power leads. The method may also include bending the set of signal leads and the set of power leads to a desired angle configured to couple with a substrate.

Implementations of a method of manufacturing semiconductor packages may include one, all, or any of the following:

The plurality of press fit pins may be singulated press fit pins.

The method may further include coupling, prior to welding, soldering, or brazing each press fit pin into a jig, a portion of each signal lead of the set of signal leads into the jig, and a portion of each power lead of the set of power leads into the jig.

The plurality of press fit pins may be framed press fit pins.

The method may further include singulating the plurality of press fit pins from a frame after welding, soldering, or brazing.

The welding, soldering, or brazing may further include one of ultrasonic welding, soldering, or brazing and laser welding, soldering, or brazing.

The method may further include coupling a lead supporter to the set of signal leads and the set of power leads and to the power module, wherein the lead supporter is configured to prevent deformation of the set of signal leads and the set of power leads.

The leadframe may include 99.9% purity copper and the press fit pins may include a CuCrAgFeTiSi alloy.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor packages will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

Figure 1:
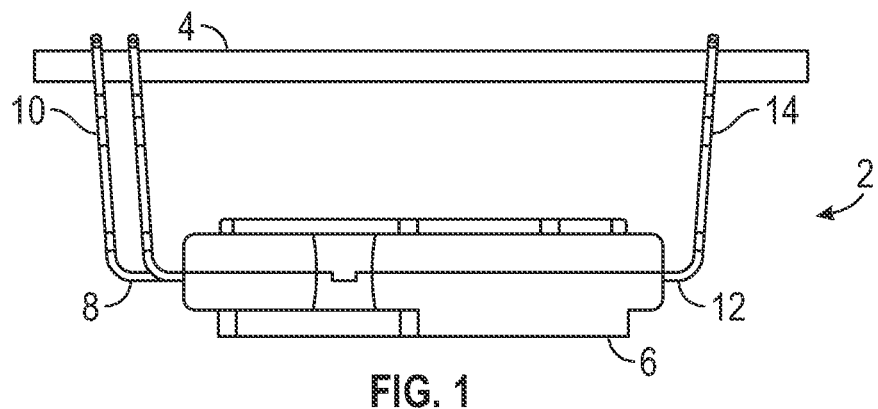
FIG. 1 is a side view of an implementation of a semiconductor package coupled with a printed circuit board (PCB)

Referring to FIG. 1, an implementation of a semiconductor package 2 coupled with a printed circuit board (PCB) 4 is illustrated. As illustrated, the semiconductor package 2 includes a power module 6 having a set of signal leads 8 coupled to the power module 6 on one side. The power module may include, by non-limiting example, one of a switch, a rectifier, or an inverter. The set of signal leads 8 are coupled to the PCB through press fit pins 10 that couple into openings formed into the printed circuit board. These openings may be drilled or otherwise formed vias through the PCB in particular implementations. However, in other implementations, the press fit pins 10 may couple into pin receivers formed on the PCB or coupled thereto via welding, soldering, or brazing.

On a side of the power module 6 opposing the set of signal leads 8 a set of power leads 12 are coupled to the power module 6. The power leads 12 are coupled to the PCB through press fit pins 14. In various implementations, the press fit pins 14 may be coupled to the PCB through openings in the PCB or through pin receivers like any disclosed herein. Press fits pins 10 and 14 are welded, soldered, or brazed to the signal leads 8 and the power leads 12, respectively. In particular implementations, the press fit pins 10, 14 are welded (or soldered, or brazed) to the ends of the signal leads 8 and power leads 12, respectively, leads using a jig or guide. In various implementations, the leads 8 and 12 are made from high purity material for thermal and electrical performance and the press-fit pins are made from a different material better adapted for bonding performance than the material of the leads.

While the power module 6 illustrated in FIG. 1 has both leads 8 and power leads 12, in particular implementations, only one set of leads may be used, either the leads 8 or the power leads 12. In some implementations, the leads 8 may be distributed on both opposing sides of the power module; in others the power leads 12 may be distributed on both opposing sides of the power module. In other implementations, the leads 8 may be distributed on adjacent sides of the power module; in others the power leads 12 may be distributed on adjacent sides of the power module. In yet other implementations, the leads 8 may be distributed on more than two sides of the power module; and in others the power leads may be distributed on more than two sides of the power module.

The material of the press-fit pins may have certain properties in order to allow the press-fit pins to withstand the forces of insertion and extraction of the press-fit pins to substrates. In some implementations, the press-fit pins may be made from a CuCrAgFeTiSi alloy marketed under the tradename K88™ by Wieland-Werk, AG of Ulm, Germany. In such implementations, the material may be selected because of its desired yield strength in combination with its electrical conductivity and good stress relaxation resistance. Various other metal alloy materials may be employed for use as the press-fit pins based on consideration of these three material properties of the alloy. In various implementations, the press-fit pins may be formed of tin, nickel, other copper tin alloys such as $CuSn_4$, $CuSn_6$, CuNiSi, or other suitable materials having the desired yield strength and electrical conductivity. The structure of implementations of semiconductor packages as described herein may decrease co-planarity problems seen in other semiconductor packages. Press-fit pin insertion may be a fast, inexpensive, and reliable manufacturing process that allows repair of a press-fit pin up to two times in a device. In this way, since the press-fit pins can be repaired, the power module can be reused beyond the lifetime of any particular press-fit pin.

In various implementations, the power module includes one or more die electrically coupled to a leadframe. The leadframe may be included within a housing. The leadframe may, by non-limiting example, be made of 99.9% purity copper (or higher than 99% copper), though in various implementations other purities of copper (more or less pure) or other metals may be used, such as, by non-limiting example, silver, gold, aluminum, any combination thereof, and any other electrically conductive metal. In various implementations, where the leadframe includes 99.9% or higher purity copper, the copper material may be unsuitable for use as a press fit pin because it may deform/bend too much to successfully function as a press fit pin. As previously described, press fit pins may be coupled with either or both the signal set of leads and the power leads. In various implementations, the press fit pins may be coupled to the leads through, by non-limiting example, welding, soldering, brazing, laser welding, ultrasonic welding, thermal welding, laser soldering, laser brazing, ultrasonic soldering, ultrasonic brazing, or any other suitable for coupling the metals of the leads to the press fit pins while preserving electrical conductivity. In various implementations of semiconductor packages as described herein the press fit pins are not integrated into the original structure of the lead frame as in other semiconductor packages but are separately coupled with the leads in a subsequent process. By non-limiting example, the press-fit pins may be, by non-limiting example, a solid pin having a solid press-in zone, a compliant pin having an elastic press-in zone, or any other type of structure designed to function like a press fit pin. Compliant pins are designed to deform during insertion and sustain a permanent contact normal force when inserted into a reliable electrical and mechanical connection such as a PCB.

In various implementations, the semiconductor package may include a wide variety of other electrical components, including, by non-limiting example, coils, capacitors, actuators, sensors, active electrical components, passive electrical components, any combination thereof, and any other electrically operated and/or electrically conductive structure or device that can fit within the housing of the semiconductor package. By non-limiting example, power modules with having housings like those disclosed herein may be anti-lock braking (ABS) modules, electronic stability control (ESC) modules, sensor modules, antitheft antennae, antitheft modules, power distribution modules, power conversion modules, power regulation modules, and any other discrete device capable of being placed in a housing. The use of press-fit pins in these applications may make the assembly process of the application easier and more reliable.

Figure 2A:
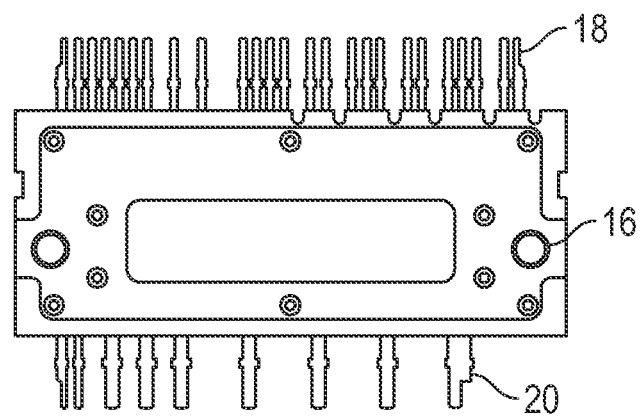
FIG. 2A is a top view of a power module having trimmed leads.
Figure 2B:
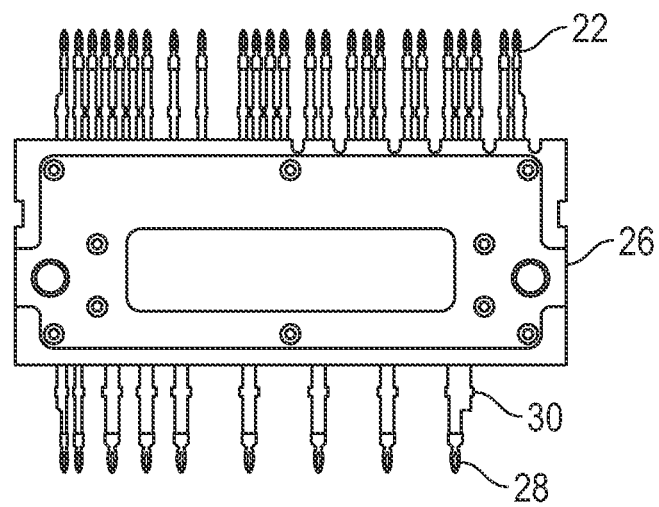
FIG. 2B is a top view of a power module having press fit pins coupled to the trimmed leads.

Referring to FIGS. 2A-2E, the configuration of a package at or after various steps in an implementation of a method for manufacturing semiconductor packages is illustrated. Referring to FIG. 2A, the a power module 16 having a set of signal leads 18 on a first side of the power module and a set of power leads 20 on a second side of the power module is illustrated. The method includes trimming the lengths of the signal leads 18 and the lengths of the power leads 20. The leads may be trimmed using, by non-limiting example, a lead cutting machine, cutters, pliers, or other suitable equipment for trimming leads. As shown in FIG. 2B, the power module 16 is illustrated following welding (or soldering or brazing) a press fit pin of a plurality of press fit pins 22 to each lead of the signal leads of the power module 26. The process of welding (or soldering or brazing) may be any disclosed in this document. A press fit pin of a plurality of press fit pins 28 may also be welded to each of the power leads 30 of the power module 26 in various implementations of the method. As previously discussed, the process of welding (or soldering or brazing) the press fit pins depends on the location of the particular leads on the package. The process illustrated in FIGS. 2A-2E illustrates the process where the plurality of leads 18 and power leads 20 are on opposing sides. In implementations where there are only leads or power leads, the method includes welding (or soldering or brazing) press fit pins on only the leads that are present. In implementations where the leads are on adjacent sides or more than one side, the process of welding may take place through multiple steps, the press fit pins on one side at a time, or on multiple sides at a time. In some implementations, the press fit pins may not be welded simultaneously on a single side; rather one or more may be welded and the rest welded in one or more additional welding steps.

In various implementations, the plurality of press fit pins may be singulated press fit pins. In other implementations, the plurality of press fit pins may be framed press fit pins. Prior to welding (or soldering or brazing), the method may further include coupling one, all, or any of the press fit pins into a jig. In particular implementations, the method may include coupling a portion of each single lead of the set of signal leads into the jig. In various implementations the method may include coupling a portion of each power lead of the set of power leads into the jig. In some method implementations, both the signal leads and the power leads may be coupled with a jig for welding, soldering, or brazing. Welding support structures similar to those illustrated in FIGS. 5 and 6 may be used in various implementations.

Figure 2C:
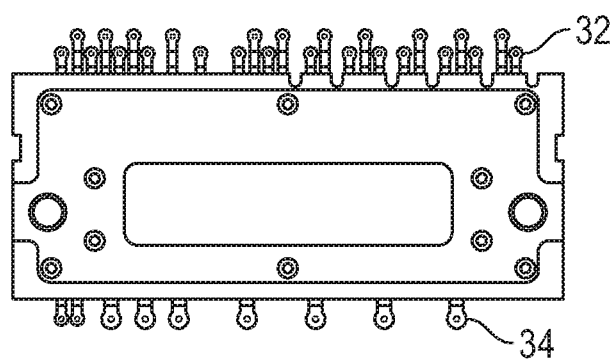
FIG. 2C is top view of a power module having the leads bent.
Figure 2D:
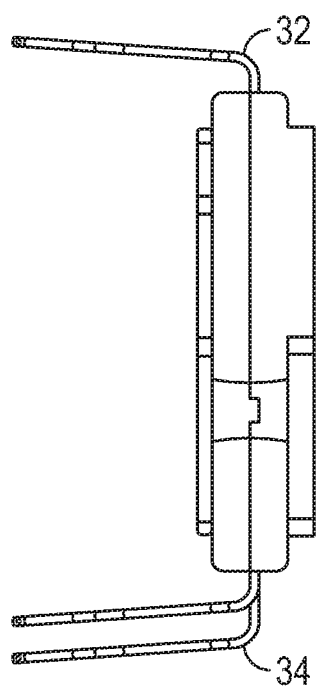
FIG. 2D is a side view of an implementation of a semiconductor package having the trimmed leads bent.
Figure 2E:
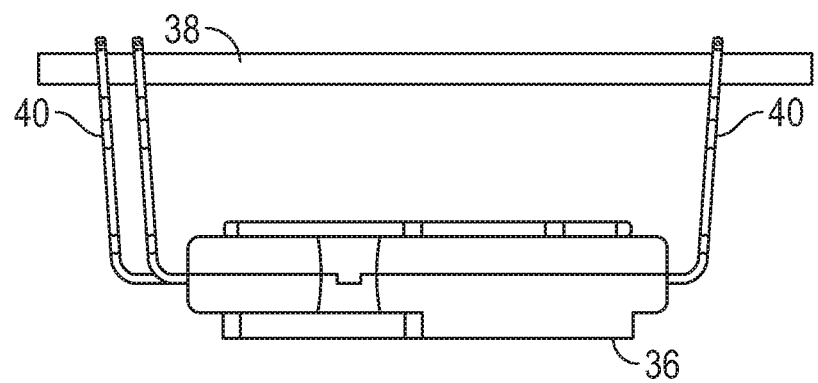
FIG. 2E is a side view of an implementation of a semiconductor package coupled with a printed circuit board (PCB)

Referring to FIGS. 2C and 2D, the method may include bending the set of signal leads 32 and the set of power leads 34 to a desired angle configured to couple with a substrate such as a PCB. Referring to FIG. 2E, the method may further include coupling the semiconductor package 36 to a substrate 38 through the press fit pins 40. The substrate may include a PCB made from suitable materials such as fire retardant 4 (FR-4) glass epoxy, fire retardant 5 (FR-5), and Bismaleimide-Triazine (BT) resin, or direct bonded copper (DBC). In various implementations, the method may further include coupling a lead supporter to the set of signal leads and the set of power leads. The lead supporter may be configured to prevent deformation of the set of signal leads and the set of power leads during transport and/or during insertion.

Figure 6:
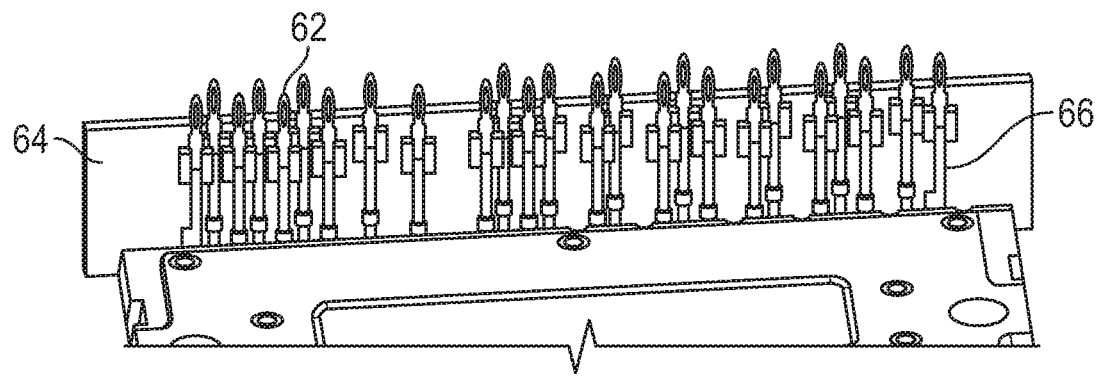
FIG. 6 is an implementation of a semiconductor package coupled with a press-fit insertion supporter pocket.

In various implementations, molded power modules having signal leads on one side of the power module and having power leads on the opposite side of the power module may be placed into the X-axis of a positioning guider jig. The signal leads and power leads may be trimmed to a predetermined length before being placed into the guider jig. A set of press fit pins may also be placed into the guider jig in a Y-axis position. In some implementations, the press-fit pins may be singulated press-fit pins. In other implementations, the press-fit pins may be frame type press-fit pins. The press-fit pins and the leads of the power module may be coupled through welding, soldering, or brazing. In various implementations, the welded press-fit signal leads and welded press-fit power leads may be placed in a supporter pocket as illustrated in FIG. 6 during insertion of the semiconductor package into a substrate such as a PCB. The welding/soldering/brazing of the leads with the press fit pins may provide a stronger and more reliable connection than seen in packages using a click or insert coupling mechanism between the leads and the press-fit pins. However, in some implementations, one, some, or all of the press fit pins may be coupled using a click or insert coupling mechanism between the leads and the press-fit pins.

Figure 3:
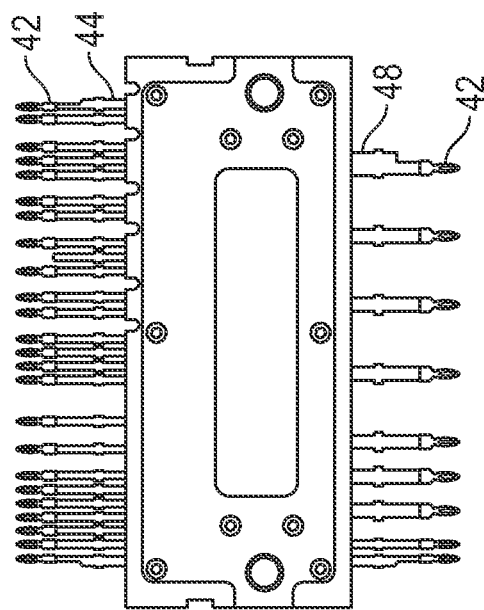
FIG. 3 illustrates an implementation of method of coupling singulated press fit pins to trimmed leads of a power module.
Figure 3:
Figure 3:
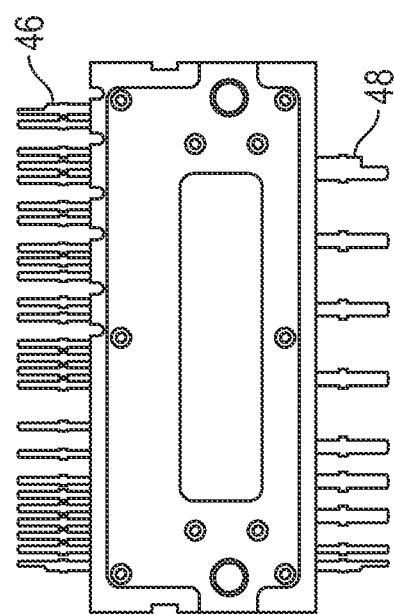
Figure 3:
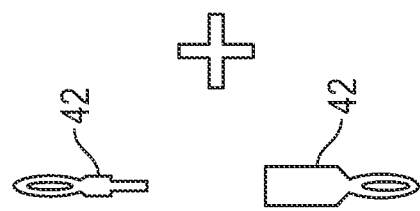

Referring to FIG. 3, another implementation of a method of manufacturing semiconductor packages including a plurality of singulated press fit pins 42 is illustrated. A power module 44 having a set of signal leads 46 and a set of power leads 48 is shown with the signal leads 46 and the power leads 48 trimmed. The plurality of singulated press fit pins 42 may be welded to the set of signal leads 46 and the set of power leads 48 through various methods of welding, soldering, or brazing disclosed herein.

Figure 4:
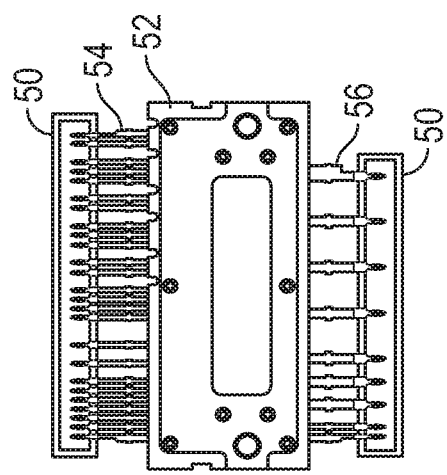
FIG. 4 is another implementation of a method of coupling frame type press fit pins to trimmed leads of a power module.

Referring to FIG. 4, another implementation of a method of manufacturing semiconductor packages including a plurality of framed press fit pins 50 is illustrated. A power module 52 having a set of signal leads 54 and a set of power leads 56 is illustrated with the signal leads 54 and the power leads 56 trimmed. The plurality of framed press fit pins 50 may be welded to the set of signal leads 54 and the set of power leads 54 through welding, soldering, or brazing as previous described. The method further includes singulating the press fit pins 50 from the frame after the press fit pins 50 have been welded to the leads 54 and 56 of the power module 52.

Figure 5:
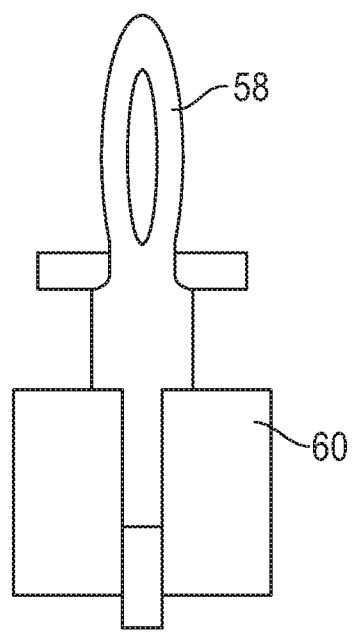
FIG. 5 is an implementation of a press-fit pin coupled in a welding jig.

Referring now to FIG. 5, a single press fit pin 58 in a welding, soldering, or brazing jig 60 is illustrated. The jig may help keep the press fit pin coupled with the corresponding lead before and during the welding process. Referring to FIG. 6, a plurality of press-fit pins 62 supported by a press-fit insertion supporter pocket 64 is illustrated. The press-fit insertion supporter pocket 64 may be used to keep the press fit pins 62 coupled with the leads 66 before and during the welding process. In other implementations, the supporter pocket 64 may also be used to support the weld position between the leads 66 and the press-fit pins 62 during insertion of the power module into a substrate and/or during transport of the power module.

The structure and method described herein may be applied to a variety of applications using press-fit pin connectivity including press-fit pin headers, integrated housings or modules, or any other semiconductor packages using a combination of leads and press-fit pins. Press-fit pin headers specifically include an assembly of a plastic housing with contact terminals. As described herein the terminals could be trimmed and the press-fit pins welded, soldered, or brazed to the end. This would allow the terminals and press-fit pins to be made of different materials without affecting the performance of the package or the press-fit pins. Such technology may be used in home appliances, the automotive industry, in industrial applications, or in other applications requiring high performance electronics with high reliability connections.

Use of press-fit pins on both the power leads and signal/signal leads in various power module implementations like those disclosed herein may help resolve solder crack issues for high power applications for power modules. The method of manufacturing a semiconductor as described may be performed on current equipment with minimal process change or machine modification while maintaining if not increasing the performance of the semiconductor packages.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A method of manufacturing a semiconductor package, the method comprising:
   providing a power module comprising a first set of leads on a first side and a second set of leads on a second side;
   trimming a length of the first set of leads and a length of the second set of leads;
   one of welding, soldering, or brazing a press fit pin to each lead of the first set of leads and to each lead of the second set of leads to form a plurality of press fit pins; and
   bending the first set of leads and the second set of leads to a desired angle configured to couple with a substrate.

2. The method of claim 1, wherein the press fit pin is a singulated press fit pin.

3. The method of claim 1, wherein the press fit pin is a framed press fit pin.

4. The method of claim 1, further comprising singulating the plurality of press fit pins from a frame after the one of welding, soldering, or brazing.

5. The method of claim 1, wherein the one of welding, soldering, or brazing are one of ultrasonic welding, laser welding, ultrasonic soldering, ultrasonic brazing, or laser brazing.

6. The method of claim 1, further comprising coupling a lead supporter to the first set of leads, the second set of leads, and to the power module where the lead supporter is configured to prevent deformation of the first set of leads and the second set of leads.

7. The method of claim 1, wherein the first set of leads and the second set of leads comprise 99.9% purity copper and the plurality of press fit pins comprise a CuCrAgFeTiSi alloy.

8. A method of manufacturing a semiconductor package, the method comprising:
   providing a power module comprising a first set of leads on a first side and a second set of leads on a second side;
   coupling a plurality of press fit pins into a jig;
   coupling a portion of each lead of the first set of leads into the jig;
   coupling a portion of each lead of the second set of leads into the jig;
   one of welding, soldering, or brazing a press fit pin of the plurality of press fit pins to each lead of the first set of leads and to each lead of the second set of leads; and
   bending the first set of leads and the second set of leads to a desired angle configured to couple with a substrate.

9. The method of claim 8, wherein the press fit pin is a singulated press fit pin.

10. The method of claim 8, wherein the press fit pin is a framed press fit pin.

11. The method of claim 8, further comprising singulating the plurality of press fit pins from a frame after the one of welding, soldering, or brazing.

12. The method of claim 8, wherein the one of welding, soldering, or brazing are one of ultrasonic welding, laser welding, ultrasonic soldering, ultrasonic brazing, or laser brazing.

13. The method of claim 8, further comprising coupling a lead supporter to the first set of leads, the second set of leads, and to the power module where the lead supporter is configured to prevent deformation of the first set of leads and the second set of leads.

14. The method of claim 8, wherein the first set of leads and the second set of leads comprise 99.9% purity copper and the plurality of press fit pins comprise a CuCrAgFeTiSi alloy.

15. A method of manufacturing a semiconductor package, the method comprising:
   providing one or more die electrically coupled to a leadframe, the leadframe comprised within a housing, the leadframe comprising a first set of leads extending from the housing and a second set of leads extending from the housing opposite the first set of leads;
   trimming a length of the first set of leads and a length of the second set of leads;
   one of welding, soldering, or brazing a press fit pin to each lead of the first set of leads and to each lead of the second set of leads to form a plurality of press fit pins; and
   bending the first set of leads and the second set of leads to a desired angle configured to couple with a substrate.

16. The method of claim 15, wherein the semiconductor package is a power module.

17. The method of claim 15, wherein the plurality of press fit pins are coupled to the first set of leads and the second set of leads through either one of welding, soldering, or brazing using a jig.

18. The method of claim 15, wherein the first set of leads comprises signal leads on a first side of the housing and the second set of leads comprises power leads on a second side of the housing opposing the first side.

19. The method of claim 15, wherein the leadframe comprises 99.9% purity copper.

20. The method of claim 15, wherein the plurality of press fit pins comprise a CuCrAgFeTiSi alloy.

* * * * *